(12) United States Patent
Cohn (10) Patent No.: US 7,394,028 B2
(45) Date of Patent: Jul. 1, 2008

(54) FLEXIBLE CIRCUIT SUBSTRATE FOR FLIP-CHIP-ON-FLEX APPLICATIONS

(75) Inventor: Charles Cohn, Wayne, NJ (US)

(73) Assignee: Agere Systems Inc., Allentown, PA (US)

( * ) Notice: Subject to any disclaimer, the term of this patent is extended or adjusted under 35 U.S.C. 154(b) by 60 days.

(21) Appl. No.: 11/360,200

(22) Filed: Feb. 23, 2006

(65) Prior Publication Data
US 2007/0194456 A1 Aug. 23, 2007

(51) Int. Cl.
*H01L 21/44* (2006.01)
*H01R 9/09* (2006.01)

(52) U.S. Cl. .......... 174/262; 257/698; 257/E21.59; 257/E23.068; 438/612; 438/613; 438/622; 174/255; 174/261

(58) Field of Classification Search .......... 257/778, 257/E21.59, E23.068, 698; 438/612, 613; 174/261, 262
See application file for complete search history.

(56) References Cited

U.S. PATENT DOCUMENTS

| | | | |
|---|---|---|---|
| 6,831,235 B1 * | 12/2004 | Enomoto et al. | 174/262 |
| 6,861,740 B2 | 3/2005 | Hsu | |
| 6,862,189 B2 * | 3/2005 | Higuchi | 361/767 |
| 6,891,732 B2 * | 5/2005 | Takano et al. | 361/783 |
| 2005/0121225 A1 * | 6/2005 | Hsu | 174/255 |

OTHER PUBLICATIONS

1. Patterson et al., "Reliability of Fine Pitch Solder Bump Flip-Chip-on-Flex: Designs and Assembly Techniques, Part 1," Flip Chip Technologies, 11 pages, 1998.

* cited by examiner

*Primary Examiner*—Dao H Nguyen (57) ABSTRACT

A circuit substrate for attachment to an integrated circuit chip comprises an electrical trace, a mounting pad and a dielectric layer. The mounting pad has a first surface, one or more sidewalls and a second surface. The first surface is attached to the electrical trace. The dielectric layer substantially covers the one or more sidewalls of the mounting pad and has an uppermost surface that is substantially coplanar with the second surface of the mounting pad.

19 Claims, 6 Drawing Sheets

FLEXIBLE CIRCUIT SUBSTRATE FOR FLIP-CHIP-ON-FLEX APPLICATIONS

FIELD OF THE INVENTION

This invention is directed to circuit substrates for integrated circuit chips, embodiments of the invention providing improved flexible circuit substrates for use in flip-chip-on-flex applications.

BACKGROUND OF THE INVENTION

Direct chip attachment (DCA) refers to a semiconductor assembly technology wherein an integrated circuit chip is directly mounted on and electrically connected to its final circuit substrate instead of undergoing traditional assembly and packaging. Advantageously, the elimination of conventional device packaging in DCA both simplifies the manufacturing process and reduces the space that the integrated circuit chip occupies on the final circuit substrate. It also improves performance as a result of the shorter interconnection paths between the integrated circuit chip and the circuit substrate.

Flip chip attachment to a flexible circuit substrate (flip-chip-on-flex (FCoF)) is one variant of DCA that is evolving into a mainstream process for the construction of some classes of electronic devices. A flip chip comprises an integrated circuit chip with a multiplicity of conductive solder bumps attached to the chip's bonding pads. In FCoF, these solder bumps are directly attached to a flexible circuit substrate. The flexible circuit substrate, in turn, comprises copper electrical traces that act to connect the flip chip with other electronic components in a manor similar to a conventional rigid printed circuit board. Flexible circuit substrates are used extensively in applications where their unique ability to bend and curve into flexible shapes is required. Flexible circuit substrates are used, for example, in notebook computers, hard disk drives, PCMCIA (Personal Computer Memory Card International Association) connectors, docking stations, pointing devices, compact disk players and mobile phones.

Mounting a flip chip on a flexible circuit substrate involves attaching the solder bumps on the flip chip to the copper electrical traces incorporated into the flexible circuit substrate. In a flexible circuit substrate, these copper electrical traces are typically covered with some kind of polymer coverlayer, frequently called a "solder mask." Accordingly, openings are created in the polymer coverlayer to create attachment areas that allow the solder bumps on the flip chip to access the underlying copper electrical traces. A high temperature reflow process is then used to permanently attach the solder bumps to the copper electrical traces. Subsequently, a non-conductive underfill material is dispensed into the region between the flip chip and the flexible circuit substrate. The underfill material protects the solder bumps from moisture and other environmental hazards, provides additional mechanical strength to the assembly, and compensates for any thermal expansion difference between the flip chip and the flexible circuit substrate.

Because of its many functions, the underfill material will preferably completely and uniformly fill the region between the flip chip and the flexible circuit substrate. This requires that the distance between the flip chip and flexible circuit substrate ("standoff distance") be precisely controlled. Unfortunately, in conventional FCoF applications, this standoff distance is influenced by many factors including the size of the attachment area on the flexible circuit substrate, the thickness of the polymer coverlayer (i.e., solder mask), the ductility of the solder bump alloy and the reflow profile of the solder bumps. For example, if a large attachment area is exposed on the flexible circuit substrate, a solder bump landing in that area will have a tendency to wick along the exposed copper electrical traces during the high temperature reflow process. This causes the standoff distance to decrease, compromising the application of a complete and uniform layer of underfill material between the flip chip and the flexible circuit substrate.

As a result, there is a need for an improved flexible circuit substrate for use in FCoF applications that promotes a larger and more uniform standoff distance between the flip chip and the flexible circuit substrate when compared to conventional flexible circuit substrates.

SUMMARY OF THE INVENTION

The present invention addresses the above-identified need by providing an improved flexible circuit substrate for use in FCoF applications. Embodiments of this circuit substrate use mounting pads that are substantially flush with the surface of the flexible circuit substrate. Advantageously, in this way, a larger and more uniform standoff distance is created between the flexible circuit substrate and an attached flip chip when compared to conventional flexible circuit substrates.

In accordance with an aspect of the invention, a circuit substrate for attachment to an integrated circuit chip comprises an electrical trace, a mounting pad and a dielectric layer. The mounting pad has a first surface, one or more sidewalls and a second surface. The first surface is attached to the electrical trace. The dielectric layer, in turn, substantially covers the one or more sidewalls of the mounting pad and has an uppermost surface that is substantially coplanar with the second surface of the mounting pad.

In an illustrative embodiment, a circuit substrate is flexible and is configured for attachment to a flip chip having a plurality of solder bumps. The circuit substrate comprises a plurality of electrical traces and an equal number of mounting pads. Each mounting pad has a lower surface, a sidewall and an upper surface. The lower surface of each mounting pad is attached to a respective electrical trace. A dielectric layer covers the sidewalls of the mounting pads and has an uppermost surface substantially coplanar with the upper surfaces of the mounting pads. In addition, mounting pad caps are disposed on the upper surfaces of the mounting pads, causing the mounting pad caps to slightly protrude from the uppermost surface of the dielectric layer.

Advantageously, this circuit substrate configuration causes a flip chip's solder bumps to be confined to the mounting pad caps while the flip chip is being attached to the circuit substrate. This confinement limits the collapse of the solder bumps. As a result, the standoff distance between the flip chip and the circuit substrate is more easily maintained within a range that promotes the formation of a complete and uniform layer of underfill material between flip chip and the circuit substrate. A more reliable chip/substrate assembly is thereby formed when using a circuit substrate having features in accordance with aspects of the invention.

These and other features and advantages of the present invention will become apparent from the following detailed description which is to be read in conjunction with the accompanying figures.

DETAILED DESCRIPTION OF THE INVENTION

This invention will be illustrated herein in conjunction with exemplary circuit substrates and methods for forming the exemplary circuit substrates. It should be understood, however, that the invention is not limited to the particular arrangements, materials, film layers and processing steps shown and described herein. Modifications to the illustrative embodiments will become apparent to those skilled in the art.

Particularly with respect to processing steps, it is emphasized that the descriptions provided herein are not intended to encompass all of the processing steps which may be required to successfully form a functional circuit substrate. Rather, certain processing steps which are conventionally used in forming such circuit substrates, such as cleaning steps, are purposefully not described herein for economy of description. However one skilled in the art will readily recognize those processing steps omitted from this generalized description. Moreover, details of the process steps used to fabricate circuit substrates may be found in a number of publications, for example, C. A. Harper, editor, *Electronic Materials and Processes Handbook, Third Edition*, McGraw-Hill, 2003, which is incorporated herein by reference.

It should also be understood that the various layers and/or regions shown in the accompanying figures are not drawn to scale. Moreover, for economy of description, the figures are restricted to only those regions of illustrative circuit substrates that are required to show aspects of the invention. In actual application, a circuit substrate in accordance with aspects of the invention will likely be more extensive than those circuit substrates illustrated herein. However, these more extensive circuit substrates will still come within the scope of the invention.

Figure 1A:
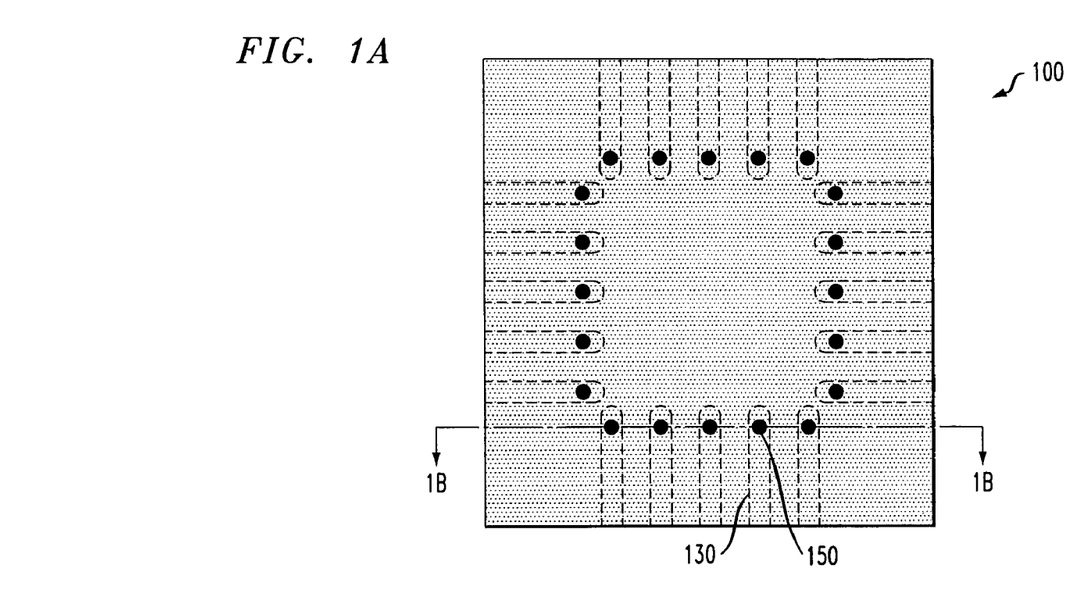
FIG. 1A shows a plan view of a circuit substrate in accordance with an illustrative embodiment of the invention.
Figure 1B:
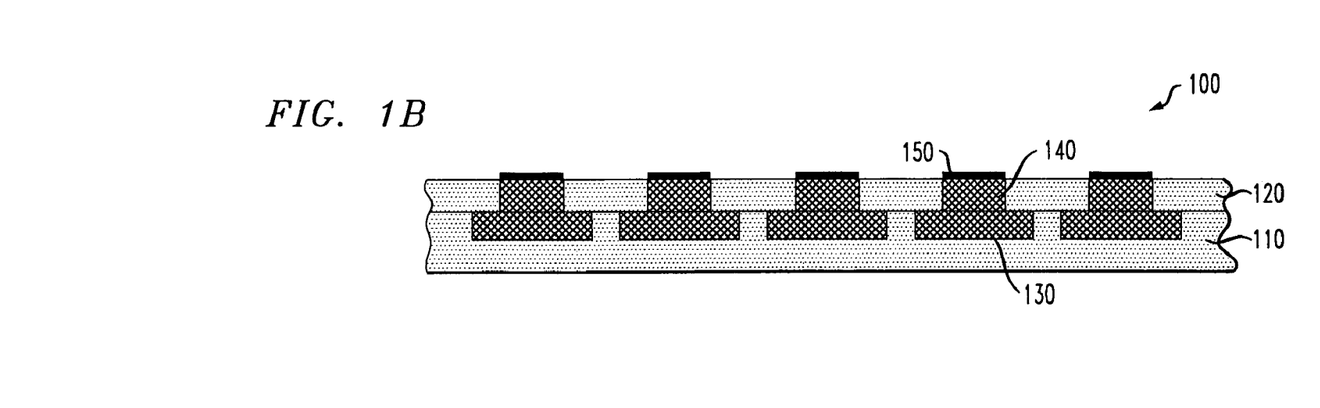
FIG. 1B shows a sectional view of the FIG. 1A circuit substrate.

FIGS. 1A and 1B show a circuit substrate 100 in accordance with an illustrative embodiment of the invention. FIG. 1A is a plan view, while FIG. 1B is magnified sectional view cut in the plane indicated in FIG. 1A. The circuit substrate comprises a lower dielectric layer 110 and an upper dielectric layer 120. Incorporated in these dielectric layers is a multiplicity of electrical traces, represented collectively by electrical trace 130. Mounting pads, represented collectively by mounting pad 140, are attached to the upper surface of each electrical trace. Finally, mounting pad caps, represented collectively by mounting pad cap 150, are attached to the upper surface of each mounting pad.

For illustrative purposes, the mounting pads 140 shown in FIGS. 1A and 1B are circular in a plane defined by the upper surfaces of the mounting pads. Each mounting pad therefore has a single sidewall. However, this shape is purely illustrative and other mounting pad shapes would still come within the scope of this invention. For example, in some applications, it may be preferable to use mounting pads with square shapes. Such mounting pads would have four sidewalls. A square-shaped mounting pad, may, for example, be better suited for some types of photolithographic processing equipment.

In accordance with an aspect of the invention, the circuit substrate 100 shown in FIGS. 1A and 1B is flexible. In order to be flexible, the dielectric layers 110, 120 preferably comprise a polymeric material such as, but not limited to, polyimide. The lower dielectric layer is preferably about 30 micrometers thick in the region below the mounting pads, and the upper dielectric layer is preferably about 25 micrometers thick. Nonetheless, other thicknesses may be equally suitable and will be apparent to one skilled in the art. The electrical traces 130 and mounting pads 140 preferably comprise copper because of its low electrical resistivity. The electrical traces and mounting pads preferably have thicknesses of about 25 micrometers. The mounting pad caps 150 preferably comprise gold deposited on nickel and have a total thickness of about five micrometers. The nickel inhibits copper interdiffusion between the copper mounting pads and those features attached to the opposing sides of the mounting pad caps. The gold prevents the nickel from being oxidized.

In accordance with another aspect of the invention, the particular circuit substrate 100 shown in FIGS. 1A and 1B is configured for attachment to a flip chip. Nevertheless, it should be noted that a circuit substrate need not be configured for attachment to a particular type of integrated circuit chip to fall within the scope of this invention. The design, operating characteristics and manufacturing process of flip chips will be familiar to one skilled in the art. Moreover, flip chips are described in detail in a number of readily available publications including, G. R. Blackwell, editor, *The Electronic Packaging Handbook*, CRC Press, 1999, which is incorporated herein by reference. Briefly, flip chips, like other types of integrated circuit chips, are typically manufactured in a repeated pattern on a surface of a semiconductor wafer using conventional semiconductor processing techniques. After forming the flip chips, solder bumps are attached to bond pads on tops of the flip chips while the flip chips are still incorporated in the semiconductor wafer. The bond pads of the flip chips are electrically connected to the semiconductor circuitry within the flip chips through the flip chips' metallization levels. The solder bumps, in turn, typically comprise lead and may also comprise tin. Solder bumps may be formed or placed on the flip chips in many ways, including evaporation, electroplating, printing, jetting, stud bumping and direct placement.

Figure 2A:
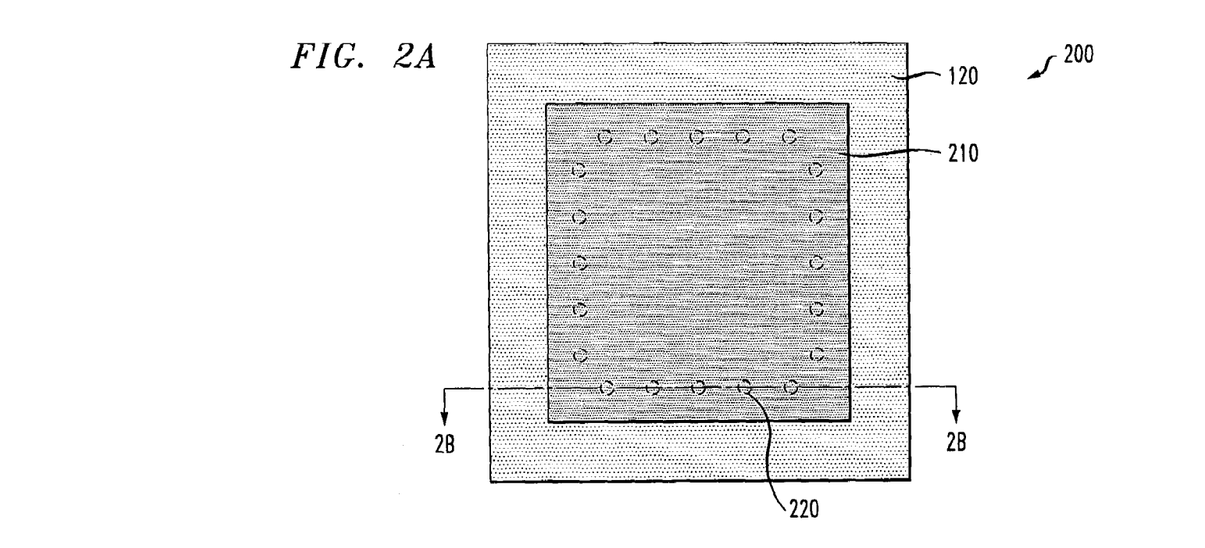
FIG. 2A shows a plan view of an assembly comprising a flip chip attached to the FIG. 1A circuit substrate.
Figure 2B:
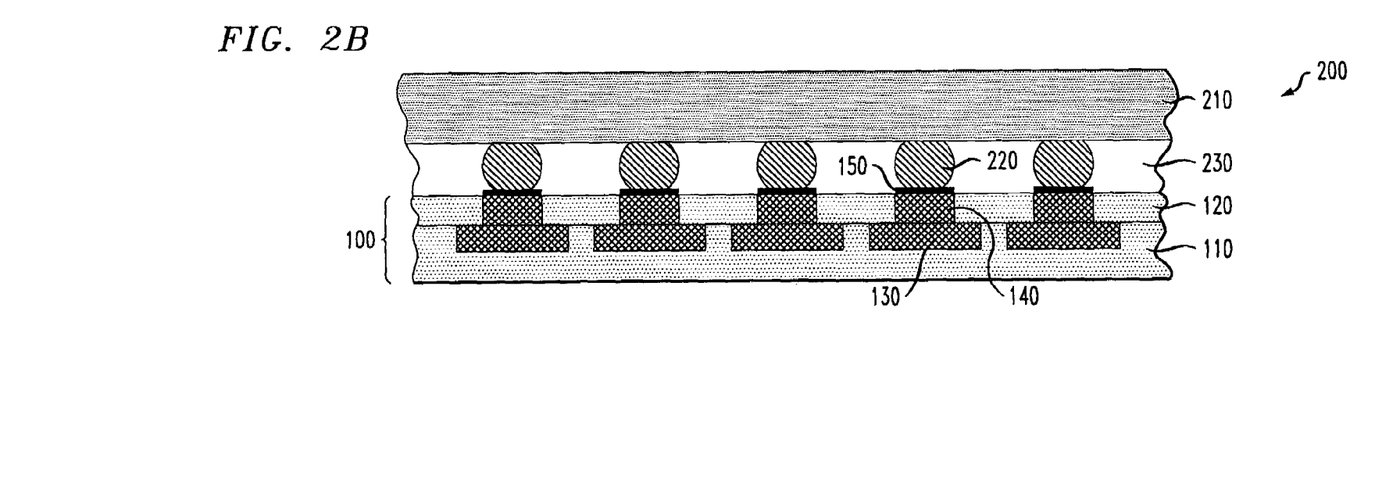
FIG. 2B shows a sectional view of the FIG. 2A assembly.

The attachment of a flip chip to the circuit substrate 100 is better understood by reference to FIGS. 2A and 2B. A plan view of an assembly 200 comprising a flip chip 210 attached to the circuit substrate 100 is shown in FIG. 2A. A magnified sectional view of the same assembly is shown in FIG. 2B, cut in the plane indicated in FIG. 2A. The flip chip comprises a multiplicity of solder bumps, collectively represented by solder bump 220. An underfill material 230 fills the region between the flip chip and the circuit substrate.

The solder bumps 220 on the flip chip 210 are arranged in such a manner that their placement matches the placement of the mounting pad caps 150 on the circuit substrate 100 when the flip chip is placed with its solder bumps down on top of the circuit substrate. This arrangement allows each solder bump to be directly attached to a corresponding mounting pad cap. Actual attachment of the flip chip to the circuit substrate is preferably accomplished by a high temperature reflow process. The temperature utilized for the high temperature reflow process depends on the particular solder alloy used for the solder bumps, and will be familiar to one skilled in the art.

It should be noted that before placing the solder bumps 220 in contact with the mounting pad caps 150, the solder bumps and/or mounting pad caps may optionally be coated with a flux material. Flux removes oxidation from the surfaces to be soldered and prevents further oxidation during the soldering process itself.

Once attachment is achieved, the underfill material 230 is preferably applied to the assembly 200. The underfill material may be needle-dispensed along one or two edges of the flip chip 210. It is drawn into the region between the flip chip and circuit substrate 100 by capillary action and then heat-cured to form a permanent bond. As stated before, a complete and uniform application of the underfill material is critical because the underfill material protects the solder bumps from moisture and other environmental hazards, provides additional mechanical strength to the assembly, and compensates for any thermal expansion difference between the flip chip and the flexible circuit substrate. The underfill material preferably comprises an epoxy adhesive.

It will be noted that, in accordance with an aspect of the invention, the uppermost surface of the upper dielectric layer 120 is substantially coplanar with the upper surfaces of the mounting pads 140. With this arrangement, the mounting pad caps 150 protrude slightly above the surface of the upper dielectric layer. This arrangement has many advantages. At least one advantage relies on the fact that during typical high temperature reflow processes, solder will spread, or wick, over metallic surfaces (i.e., "wet" the metallic surfaces) but will not spread over dielectric, non-metallic surfaces. Accordingly, after high temperature reflow, the solder bumps 220 of the flip chip 210 will tend to be confined to the tops of their respective mounting pad caps since the mounting pad caps form discrete metallic islands on the surface of the circuit substrate 100.

This confinement of the solder bumps 220 to the tops of the mounting pad caps 150 during the high temperature reflow process will limit the collapse of the solder bumps during the flip chip attachment process. The more a given solder bump spreads laterally during reflow, the more the height of the solder bump will be reduced. Where the extent of spreading is precisely controlled, however, as is the case in the embodiment described herein, the less a given solder bump will be reduced in height during attachment. A larger and more uniform standoff distance between the circuit substrate 100 and the attached flip chip 210 is thereby achieved when compared to a conventional circuit substrate. Accordingly, the standoff distance is more easily maintained within a range that promotes the formation of a complete and uniform layer of underfill material between flip chip and the circuit substrate. In so doing, a more reliable chip/substrate assembly is formed when using a circuit substrate having features in accordance with aspects of the invention.

Figure 3:
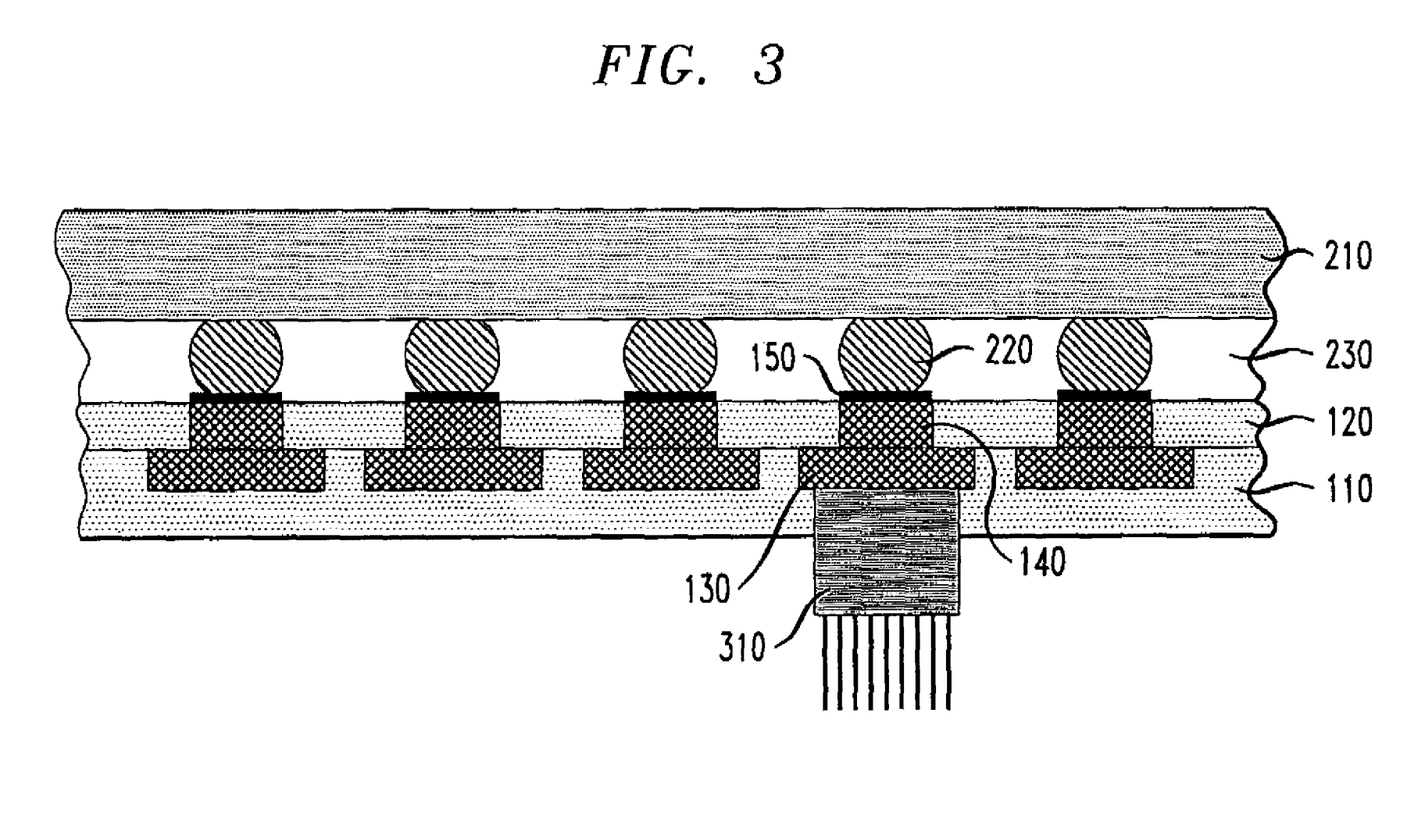
FIG. 3 shows a sectional view of the FIG. 2A assembly with an added heat sink.

Moreover, further benefits may be obtained by adding one or more heat sinks to the circuit substrate 100. FIG. 3 shows the assembly 200 with an added heat sink 310. The heat sink 310 is directly attached to the lower surface of one of the electrical traces 130. The heat sink preferably comprises a metallic material with a high thermal conductivity such as, but not limited to, copper, silver, gold or aluminum. The heat sink also preferably has fin-like protrusions that act to increase the convective transfer of heat from the heat sink to the ambient air surrounding the heat sink.

Advantageously, the electrical trace 130 attached to the heat sink 310 and that electrical trace's associated mounting pad 140 combine to form a low thermal resistance pathway from the flip chip 210 to the heat sink 310. Heat dissipation from the flip chip is thereby enhanced. Furthermore, even greater thermal dissipation enhancements can be obtained by employing multiple heat sinks like that shown in FIG. 3, or by employing a larger heat sink joined to an electrical trace attached to more than one mounting pad of equal electrical potential. Electrical traces that are attached to more than one mounting pad are frequently utilized in conventional circuit substrates as, for example, grounding bus bars.

An illustrative method of forming the circuit substrate 100 is now described with reference to FIGS. 4A-4I. Initially, an electrical trace layer 130L, preferably comprising copper, is temporarily attached to a rigid support board 420 using an adhesive, resulting in the assembly shown in FIG. 4A. The rigid support board acts to support the assembly during the initial processing steps. At this point in the process, the electrical trace layer may optionally be chemically roughened, for example, by using a solution comprising hydrochloric acid if the electrical trace layer is formed of copper. The roughening of the electrical trace layer will improve the adhesion of later deposited layers.

Figure 4A:
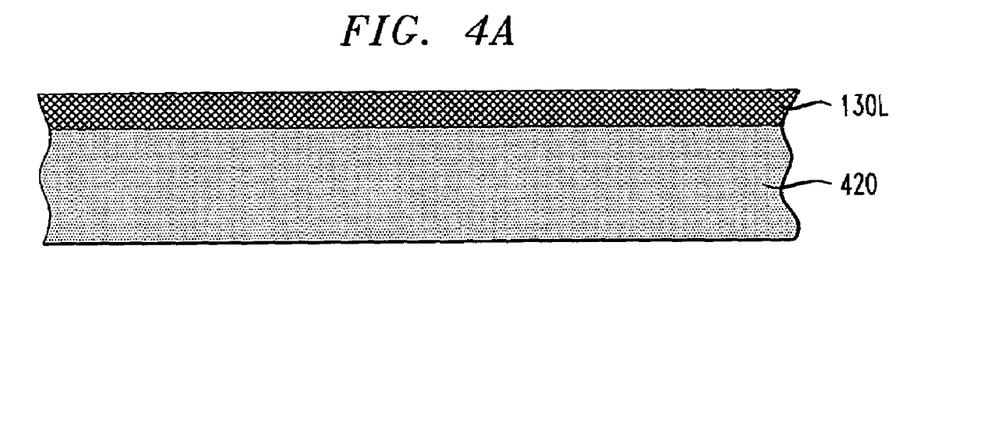
FIGS. 4A-4I shows the FIG. 1A circuit substrate during various stages of formation.
Figure 4B:
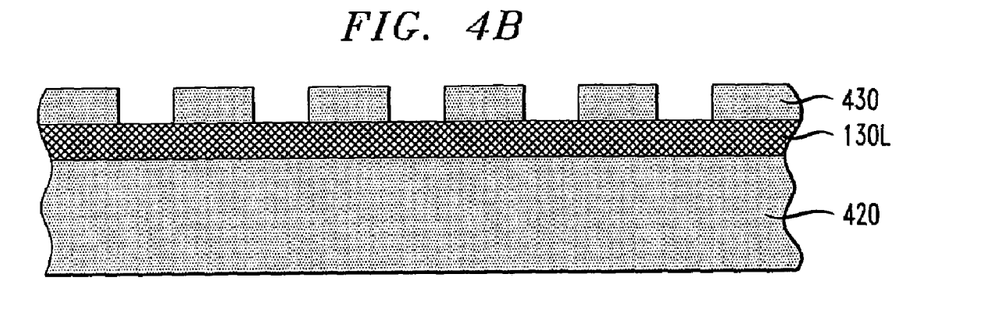
Figure 4C:
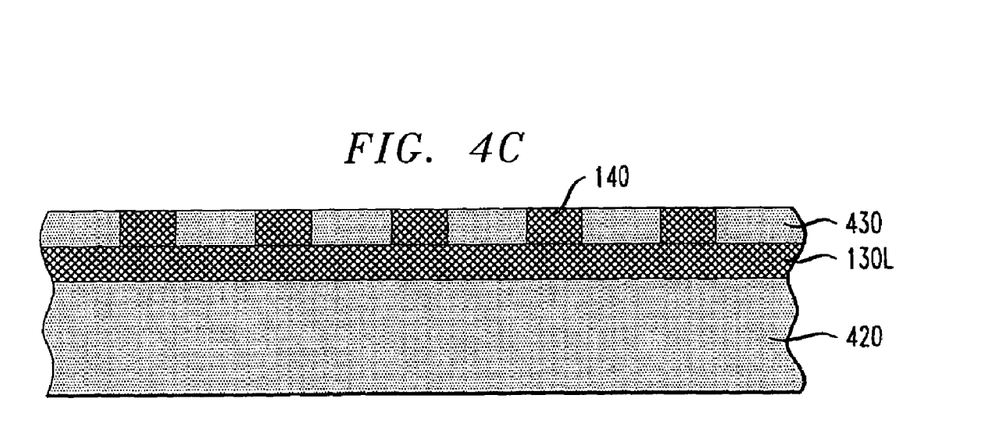

Next, the mounting pads 140 are formed by a pattern plating process. First, a first photoresist layer 430 is deposited on the FIG. 4A assembly. The first photoresist layer preferably comprises an appropriate dry-film photopolymer such as those commercially available from DuPont Printed Circuit Materials (Research Triangle Park, N.C., USA). The thickness of the first photoresist layer is preferably equal to the desired thickness of the mounting pads (e.g., 25 micrometers). A negative image of the mounting pads is then formed in the first photoresist layer by conventional exposure and development techniques. The resultant assembly is shown in FIG. 4B. Subsequently, mounting pad material, preferably comprising copper, is electroplated onto the FIG. 4B assembly. The mounting pad material only deposits on the exposed portions of the electrical trace layer 130L. Mounting pads 140 are thereby formed, as shown in FIG. 4C.

Figure 4D:
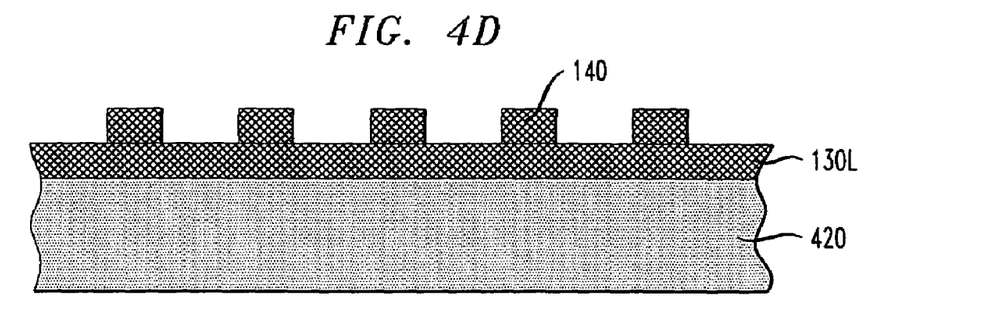
Figure 4E:
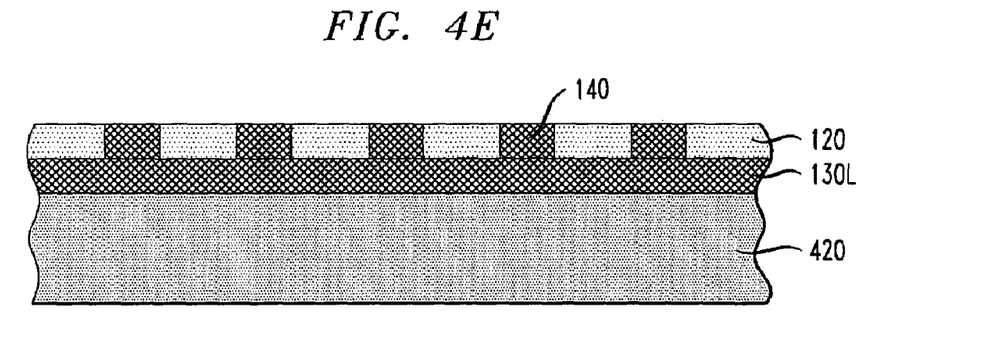

After forming the mounting pads 140, the first photoresist layer 430 is stripped, resulting in the assembly shown in FIG. 4D. Subsequently, the upper dielectric layer 120 is formed on the surface of the assembly. Formation of the upper dielectric layer is preferably by vacuum assisted lamination of a thermoplastic polymer laminate (e.g., polyimide). Such a polymer laminate is commercially available from, for example, Rogers Corporation (Rogers, Conn., USA). Lamination of these types of polymer laminates comprises applying pressure to the assembly to be laminated using a hydraulic press. The press has two heated platens that uniformly distribute heat across the assembly as pressure is applied. In vacuum assisted lamination, the platens are enclosed in a vacuum environment. With the aid of the vacuum, less pressure is needed during the lamination process and virtually no air is trapped between the polymer laminate and the substrate onto which it is being attached. The polymer laminate is then cured and any remnants of the polymer laminate that are deposited on the upper surfaces of the mounting pads are removed by a conventional alkaline permanganate-based desmearing process. The resultant assembly is shown in FIG. 4E. At this point, the temporary rigid support board 420 is no longer necessary to continue processing and may be removed.

Figure 4F:
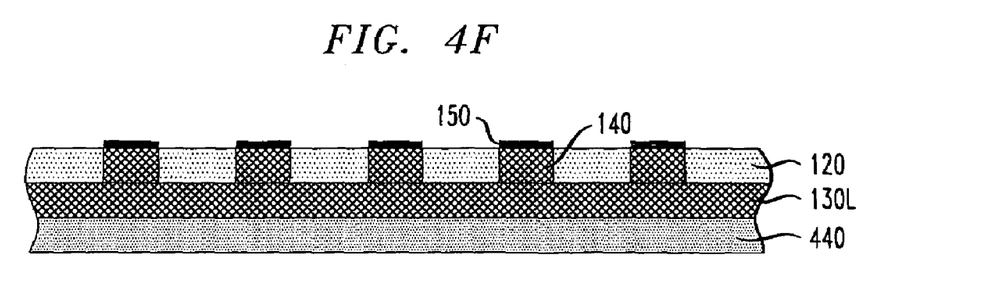

Subsequently, a second photoresist layer 440 is deposited on the lower surface of the electrical trace layer 130L. As in the case of the first photoresist layer 430, the second photoresist layer preferably comprises an appropriate dry-film photopolymer. With the second photoresist layer in place, the assembly is exposed to an electroplating process to deposit the mounting pad caps 150, preferably comprising gold deposited on nickel, on the upper surfaces of the mounting pads 140. The resultant assembly is shown in FIG. 4F.

Figure 4G:
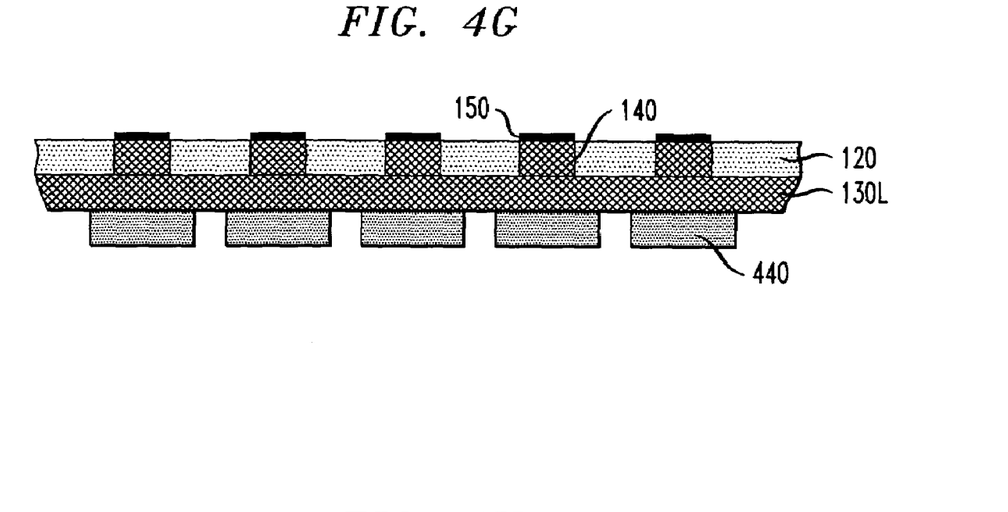
Figure 4H:
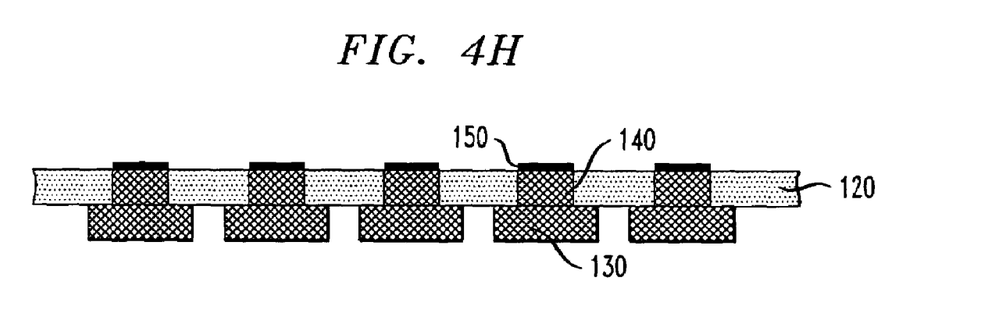

Next, a positive image of the electrical traces 130 is patterned into the second photoresist layer 440 by conventional exposure and development techniques. The resultant assembly is shown in FIG. 4G. With the patterned second photoresist layer in place, the assembly is then exposed to a wet chemical etchant that acts to etch the exposed portions of the electrical trace layer 130L so that the discrete electrical traces are defined. The wet chemical etchant may, for example, comprise a solution of ferric chloride. During this wet etching process, the mounting pad caps 150 act as an etch resist, thereby protecting the mounting pads 140 from being etched. The resultant assembly is shown in FIG. 4H. At this point, the lower surface of the electrical traces 130 may optionally be chemically roughened, again, to improve adhesion of later deposited layers.

Figure 4I:
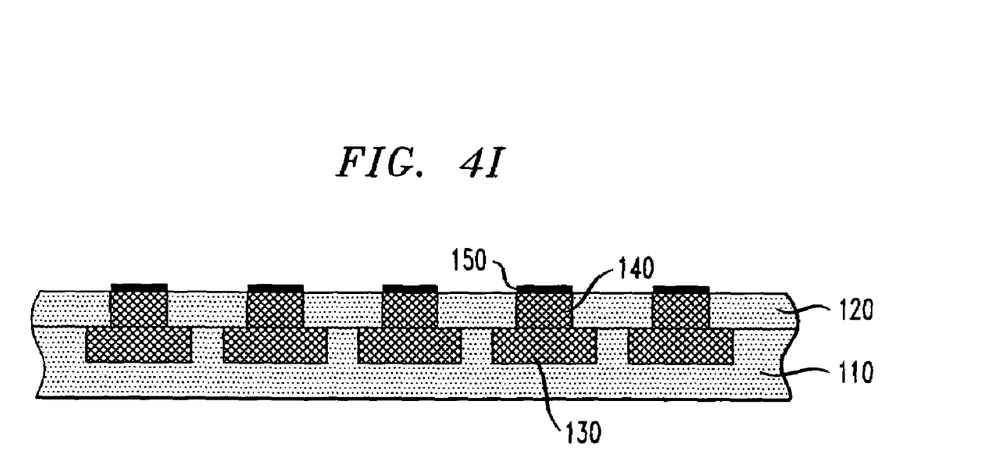

To complete the circuit substrate, a layer of lower dielectric layer material (e.g., polyimide) is pressure/vacuum laminated to the lower portion of the FIG. 4H assembly using an appropriate polymer laminate similar to that used to form the upper dielectric layer 120. This forms the lower dielectric layer 110. After curing the lower dielectric layer, the assembly shown in FIG. 4I results. The circuit substrate in FIG. 4I is identical to the circuit substrate 100 shown in FIG. 1B.

Importantly, it is to be understood that, although illustrative embodiments of the present invention have been described herein with reference to the accompanying figures, the invention is not limited to those precise embodiments. For example, a circuit substrate may be configured for attachment to an entirely different type of integrated circuit chip than that described in the illustrative embodiments and still come within the scope of the invention. Moreover, the elements and materials forming a circuit substrate may be varied in other embodiments. One skilled in the art will recognize various other changes and modifications that may be made without departing from the scope of the appended claims.

What is claimed is:

1. A method of forming an assembly, the method comprising the steps of:
   forming a circuit substrate at least in part by:
      forming an electrical trace layer;
      forming a mounting pad, the mounting pad having a first surface, one or more sidewalls and a second surface, the first surface being attached to the electrical trace layer;
      forming a dielectric layer after forming the mounting pad, the dielectric layer substantially covering the one or more sidewalls of the mounting pad and having an uppermost surface substantially coplanar with the second surface of the mounting pad;
      forming an electrical trace underlying the mounting pad by patterning the electrical trace layer after forming the mounting pad; and
      forming a mounting pad cap, the mounting pad cap disposed on the second surface of the mounting pad and protruding above the uppermost surface of the dielectric layer; and
   attaching an integrated circuit chip to the circuit substrate.

2. The method of claim 1, wherein the integrated circuit chip is a flip chip comprising a plurality of solder bumps.

3. The method of claim 2, wherein one of the solder bumps is electrically connected to the mounting pad cap on the circuit substrate.

4. The method of claim 2, further comprising the step of forming an underfill material, the underfill material filling at least a portion of a region between the circuit substrate and the flip chip.

5. A method of forming a circuit substrate for attachment to an integrated circuit chip, the method comprising the steps of:
   forming an electrical trace layer;
   forming a mounting pad, the mounting pad having a first surface, one or more sidewalls and a second surface, the first surface being attached to the electrical trace layer;
   forming a dielectric layer after forming the mounting pad, the dielectric layer substantially covering the one or more sidewalls of the mounting pad and having an uppermost surface substantially coplanar with the second surface of the mounting pad;
   forming an electrical trace underlying the mounting pad by patterning the electrical trace layer after forming the mounting pad; and
   forming a mounting pad cap, the mounting pad cap disposed on the second surface of the mounting pad and protruding above the uppermost surface of the dielectric layer.

6. The method of claim 5, wherein the circuit substrate is flexible.

7. The method of claim 5, wherein the circuit substrate is configured for attachment to a flip chip.

8. The method of claim 5, wherein the mounting pad has one sidewall.

9. The method of claim 5, wherein the mounting pad has four sidewalls.

10. The method of claim 5, wherein the mounting pad cap comprises nickel or gold, or a combination thereof.

11. The method of claim 5, further comprising the step of forming a second dielectric layer, wherein at least a portion of the electrical trace is disposed between the dielectric layer substantially covering the one or more sidewalls of the mounting pad and the second dielectric layer.

12. The method of claim 5, wherein the dielectric layer comprises a polymeric material.

13. The method of claim 5, wherein the electrical trace comprises copper.

14. The method of claim 5, wherein the mounting pad comprises copper.

15. The method of claim 5, further comprising the step of forming a heat sink.

16. The method of claim 15, wherein the heat sink is attached to the electrical trace.

17. The method of claim 5, wherein the step of forming the mounting pad comprises one or more pattern plating processes.

18. The method of claim 5, wherein the step of forming the dielectric layer comprises vacuum assisted lamination.

19. The method of claim 5, further comprising the steps of attaching a rigid support layer to the electrical trace layer and subsequently detaching the rigid support layer from the electrical trace layer.

* * * * *